(12) United States Patent
Burcea

(10) Patent No.: US 8,587,350 B2
(45) Date of Patent: Nov. 19, 2013

(54) CLOCK GENERATION SYSTEM

(75) Inventor: George Burcea, Ajax (CA)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/408,474

(22) Filed: Feb. 29, 2012

(65) Prior Publication Data

US 2012/0262207 A1 Oct. 18, 2012

(30) Foreign Application Priority Data

Apr. 13, 2011 (EP) ..................................... 11162284

(51) Int. Cl.
*H03L 7/00* (2006.01)

(52) U.S. Cl.
USPC ............................. 327/144; 327/147; 327/156

(58) Field of Classification Search
USPC .............. 327/141, 144–163; 331/1/A, 15–17; 375/373–376
See application file for complete search history.

(56) References Cited

U.S. PATENT DOCUMENTS

| | | | |
|---|---|---|---|
| 6,111,470 A | 8/2000 | Dufour | |
| 7,095,261 B2 * | 8/2006 | Drexler et al. | 327/158 |
| 7,184,503 B2 * | 2/2007 | Wong et al. | 375/354 |
| 8,368,438 B2 * | 2/2013 | Furuta | 327/156 |
| 2001/0055357 A1 * | 12/2001 | Chen | 375/376 |
| 2004/0232997 A1 * | 11/2004 | Hein et al. | 331/16 |
| 2005/0280407 A1 * | 12/2005 | Loke et al. | 324/76.54 |
| 2005/0280476 A1 * | 12/2005 | Abe et al. | 331/17 |
| 2007/0071155 A1 * | 3/2007 | Boerstler et al. | 375/376 |
| 2008/0063131 A1 * | 3/2008 | Furuta | 375/376 |
| 2008/0116946 A1 * | 5/2008 | Masson | 327/149 |
| 2010/0134159 A1 * | 6/2010 | Jin | 327/156 |
| 2010/0201408 A1 | 8/2010 | Burcea | |

FOREIGN PATENT DOCUMENTS

EP   2 207 263   7/2010

* cited by examiner

*Primary Examiner* — Lincoln Donovan
*Assistant Examiner* — Brandon S Cole
(74) *Attorney, Agent, or Firm* — Cozen O'Connor

(57) ABSTRACT

A clock generation system for deriving a second clock signal from a first clock signal with a predetermined clock frequency ratio, where the first clock frequency is divided by a first integer, the second clock signal is divided by a second integer, an error signal is generated by comparing the division results, a voltage-controlled oscillator is controlled in dependence on said error signal to generate the second clock signal, and a switch is provided for alternately switching each of the clock signals to a single frequency divider or for alternately switching one of the clock signals to one of two frequency dividers and simultaneously switching the other one of the clock signals to the other one of the two frequency dividers to eliminate errors that may result from processing the two clock signals in different circuit sections.

3 Claims, 2 Drawing Sheets

US 8,587,350 B2

CLOCK GENERATION SYSTEM

BACKGROUND OF THE INVENTION

1. Field of the Invention

The present invention relates clock generators and, more particularly, to a clock generation system for generating a first clock signal at a first clock frequency and a second clock signal at a second clock frequency with a predetermined ratio to said first clock frequency, where the system comprises a clock signal generator providing the first clock signal, a frequency divider device having at least one frequency divider for dividing the first clock frequency by a first integer to produce a first auxiliary signal and for dividing the second clock signal by a second integer to produce a second auxiliary signal, a phase/period comparator configured to generate an error signal by comparing the first and second auxiliary signals, and a voltage-controlled oscillator controlled in dependence on the error signal to generate the second clock signal.

2. Description of the Related Art

EP 2 207 263 A1 discloses two clock generator systems for generating second clock signals with slightly different frequency ratios to the first clock signal so that the second clock signals have slightly different frequencies. Given suitable selection of integer divisors of the clock system, a single such system may be used to generate the second clock signal with the desired slightly different frequency to the first clock signal.

In such a conventional system, the first and second clock signals are processed by different circuit sections before reaching the phase/period comparator. Therefore, any mismatch between the different circuit sections, such as different propagation delay times or offset voltages due to manufacturing tolerances, thermal drift or aging, may result in an error of the wanted frequency ratio between the first and second clock signals.

SUMMARY OF THE INVENTION

It is therefore an object of the invention to overcome the prior art drawbacks and to provide two clock signals with a defined and stable frequency ratio.

This and other objects and advantages are achieved in accordance with the invention by providing a clock generation system with a switch for alternately switching each of the first and second clock signals to a single frequency divider or for alternately switching one of the first and second clock signals to one of two frequency dividers and simultaneously switching the other one of the first and second clock signals to the other one of the two frequency dividers, and a controller for controlling the at least one frequency divider to perform a division with the first integer when the first clock signal is provided and to perform the division with the second integer when the second clock signal, and a phase/period comparator that is configured to generate an error signal (ERR) from the comparison of first and second auxiliary signals obtained from two consecutive positions of the switch.

In accordance with the invention, the switch alternately and successively couples the first and second clock signals to the only signal path or, in case of different signal paths, to the different signal paths between the switch and the phase/period comparator. As a result, any error in the signal path or signal will affect both clock signals equally and will be compensated by the comparison in the phase/period comparator.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention will be now further described by way of preferred example and with reference to the accompanying drawing, in which.

DETAILED DESCRIPTION OF THE PREFERRED EMBODIMENTS

Figure 1:
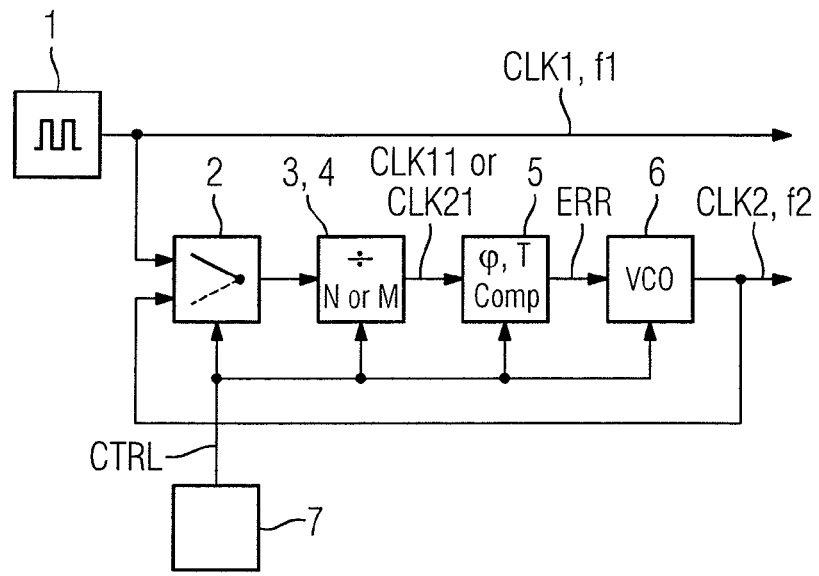
FIG. 1 shows an exemplary schematic block diagram of a clock generation system in accordance with the invention.

FIG. 1 shows a clock generation system in which a clock signal generator 1 provides a first clock signal CLK1 at a clock frequency f1. The first clock signal CLK1 is applied to a first input of a switch 2 that comprises a change-over switch or two-to-one multiplexer having two inputs and one output. The output of the switch 2 is connected to a frequency divider device 3 which comprises a single frequency divider 4 and the output of which is supplied to a phase/period comparator 5. The phase/period comparator 5 generates an error signal ERR and controls a voltage-controlled oscillator (VCO) 6 to generate a second clock signal CLK2 having a clock frequency f2. The voltage-controlled oscillator 6 is controlled such that the clock frequency f2 is maintained constant when the error signal ERR is zero, while it is otherwise changed. The second clock signal CLK2 is fed back to the second input of the switch 2. The switch 2, frequency divider 4, phase/period comparator 5 and voltage-controlled oscillator 6 are controlled by a control signal CTRL of a controller 7.

The controller 7 controls the switch 2 to alternately couple either the first clock signal CLK1 or the second clock signal CLK2 to the frequency divider 4.

The controller 7 further controls the frequency divider 4 to perform a division with a first integer N when the first clock signals CLK1 is provided and to perform a division with the second integer M when the second clock signal CLK2 is provided. Accordingly, the divider alternately produces a first auxiliary signal CLK11 at a frequency f1/N and a second auxiliary signal CLK21 at a frequency f2/M.

The phase/period comparator 5 is configured and controlled to generate the error signal ERR by comparing the first and second auxiliary signals CLK11 and CLK21 obtained from two consecutive positions of the switch 2. After every two measurements, one for CLK11 and one for CLK21, the control voltage of the voltage-controlled oscillator 6 is adjusted by an amount proportional with ERR so that the control voltage changes from a previous value $V_{i-1}$ to a next value $V_i$, where $V_i=V_{i-1}-k\cdot ERR$. In this way, the voltage-controlled oscillator 6 is successively adjusted to bring and maintain the frequencies f1 and f2 in-line with the relation N/f1=M/f2 or f1/f2=N/M.

If there is any error (e.g., error E) in the signal path between the switch 2 and the phase/period comparator 5 or, more precisely, the place of comparison within the phase/period comparator 5, this error E will affect both auxiliary signals CLK11 and CLK21 equally and will be eliminated by the comparison: E·N/f1=E·M/f2 or N/f1=M/f2 or f1/f2=N/M.

Figure 2:
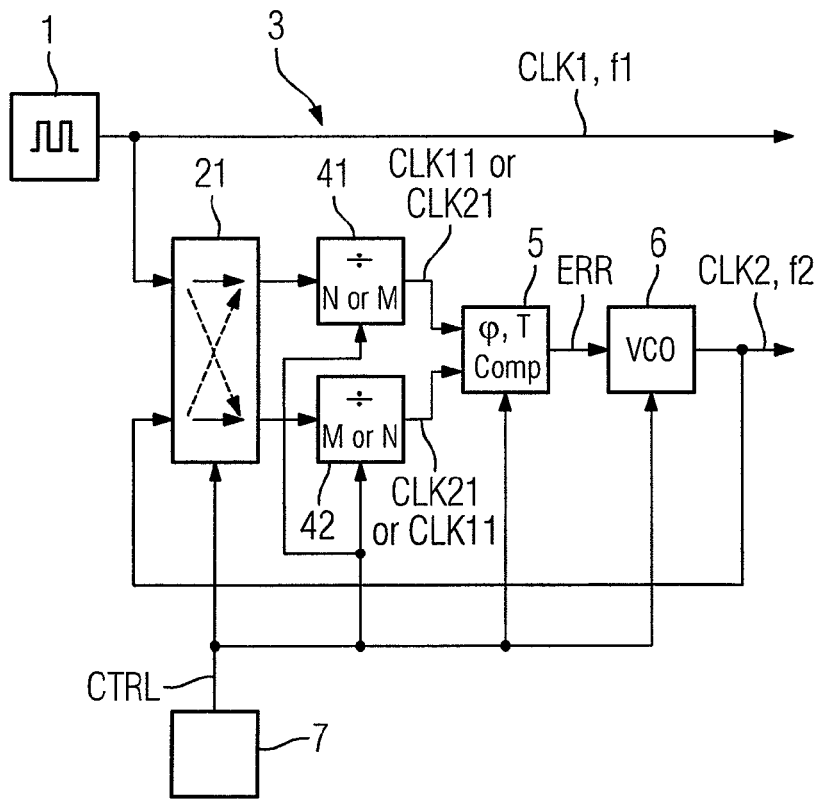
FIG. 2 shows an alternative exemplary schematic block diagram of a clock generation system in accordance with an embodiment of the invention.

FIG. 2 shows another clock generation system in which a clock signal generator 1 provides a first clock signal CLK1 at a clock frequency f1. The first clock signal CLK1 is applied to a first input of a switch 21 that is comprises a crossover switch having two inputs and two outputs. Each output of the switch 21 is connected to one of two frequency dividers 41 and 42 of a frequency divider device 3, the outputs of which are supplied to a phase/period comparator 5. The phase/period comparator 5 generates an error signal ERR and controls a voltage-controlled oscillator (VCO) 6 to generate a second clock signal CLK2 having a clock frequency f2. The second clock signal CLK2 is fed back to the second input of the switch 21. The switch 21, frequency dividers 41, 42, phase/period comparator 5 and voltage-controlled oscillator 6 are controlled by a control signal CTRL of a controller 7.

The controller 7 controls the switch 21 to alternately couple one of the first and second clock signals CLK1, CLK2 to one of two frequency dividers 41, 42 and simultaneously switch the other one of the first and second clock signals CLK1, CLK2 to the other one of the two frequency dividers 41, 42.

The controller 7 further controls the frequency dividers 41 and 42 to perform a division with a first integer N where the first clock signals CLK1 is provided and to perform a division with the second integer M where the second clock signal CLK2 is provided. Accordingly, the divider 41 produces alternately a first auxiliary signal CLK11 at a frequency f1/N and a second auxiliary signal CLK21 at a frequency f2/M while the other divider 42 alternately produces the second auxiliary signal CLK21 at the frequency f2/M and the first auxiliary signal CLK11 at the frequency f1/N.

The phase/period comparator 5 is configured and controlled to generate the error signal ERR by comparing the first and second auxiliary signals CLK11 and CLK21 obtained from two consecutive positions of the switch 2. For example, the phase/period information of the first auxiliary signal CLK11 consecutively provided by the first and second dividers 41, 42 are added up. In the same way, the phase/period information of the second auxiliary signal CLK21 consecutively provided by the second and first dividers 42, 41 are summed. The summed-up information of the first auxiliary signal CLK11 and that of the second auxiliary signal CLK21 are then compared to generate the error signal ERR. Consequently, after every two measurements, the control voltage of the voltage-controlled oscillator 6 is adjusted by an amount proportional with ERR so that the control voltage changes from a previous value $V_{i-1}$ to a new value $V_i$, where $V_i=V_{i-1}-k\cdot ERR$. In this way, the voltage-controlled oscillator 6 is successively adjusted to bring and maintain the frequencies f1 and f2 in-line with the relation N/f1=M/f2 or f1/f2=N/M.

If there is any error, e.g. E1, in the signal path from the switch 2 via the first divider 41 to the phase/period comparator 5, this error E1 will affect both auxiliary signals CLK11 and CLK21 equally. In the same way, if there is any error, e.g. E2, in the signal path from the switch 2 via the second divider 42 to the phase/period comparator 5, this error E2 will affect both auxiliary signals CLK11 and CLK21 equally. Thus, the errors E1, E2 will be compensated by the comparison:

$$(E1\cdot N/f1)+(E2\cdot N/f1)=(E1\cdot M/f2)+(E2\cdot M/f2) \text{ or } N/f1= M/f2 \text{ or } f1/f2=N/M.$$

Whereas in the simplest case the phase/period comparator 5 is of digital type, it may be of any other type, digital only or digital and analog combined. For example, if a ratio f1/f2=N/M near but not equal to 1 is wanted, integer values N, M must be large, e.g. N=300000 and M=299997, which may result in a long response time for adjusting the frequency f2 of the second clock signal CLK2. In such a case, it may be advantageous to individually weight the detected cycle durations or phasing of the first and second auxiliary signals CLK11, CLK21 by analog factors G1, G2 before they are compared to generate the error signal ERR. The voltage-controlled oscillator 6 then adjusts and maintains the relation G1·N/f1=G1·M/f2 or f1/f2=G1/G2·N/M.

Thus, the compensation of the error E in the clock generation system of FIG. 1 results to:

$$E\cdot G1\cdot N/f1=E\cdot G2\cdot M/f2 \text{ or } G1\cdot N/f1=G1\cdot M/f2 \text{ or } f1/f2=G1/G2\cdot N/M.$$

The compensation of the errors E1 and E2 in the clock generation system of FIG. 2 results to:

$$(E1\cdot G1\cdot N/f1)+(E2\cdot G1\cdot N/f1)=(E1\cdot G2\cdot M/f2)+(E2\cdot G2\cdot M/f2) \text{ or } G1\cdot N/f1=G1\cdot M/f2 \text{ or } f1/f2=G1/G2\cdot N/M.$$

Figure 3:
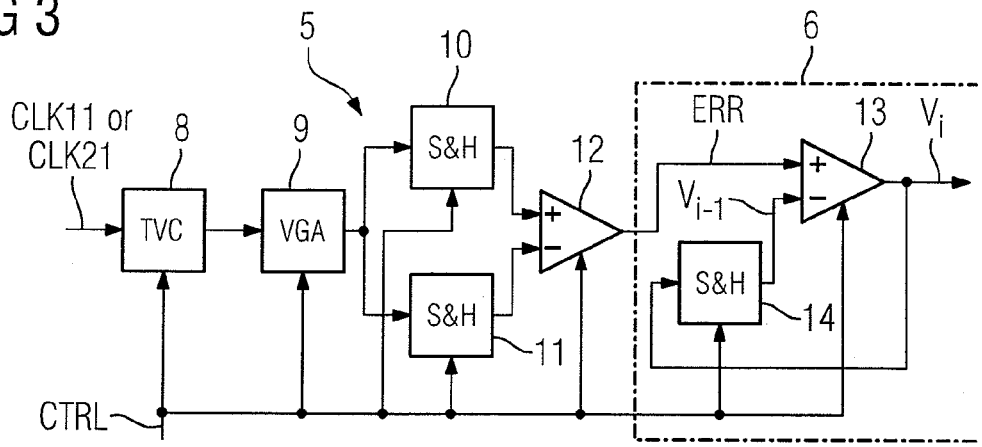
FIG. 3 is an exemplary schematic block diagram of a phase/period comparator forming part of the clock generation system of FIG. 1.

FIG. 3 shows an example of a mixed analog and digital design of the phase/period comparator 5 together with the input section of the voltage-controlled oscillator 6 of the clock generation system shown in FIG. 1. The phase/period comparator 5 comprises a time-to-voltage converter 8 which alternately in succession coverts the phase/period information of the first and second auxiliary signal CLK11, CLK21 into a voltage. This may be done in a known way by charging a capacitor with a constant current during a time interval to be measured. A variable gain amplifier 9 alternately weights the voltage obtained from the first auxiliary signal CLK11 by the factor G1 and the voltage obtained from the second auxiliary signal CLK21 by the factor G2. The weighted voltages are buffered in sample-and-hold circuits 10, 11 and provided to a first differential amplifier 12 which produces the error signal ERR.

The input section of the voltage-controlled oscillator 6 comprises a second differential amplifier 13 whose output is fed back through a sample-and-hold circuit 14 to its one input and which receives at the other input the error signal ERR. After every two measurements, the control voltage of the voltage-controlled oscillator 6 is adjusted by an amount proportional with ERR so that the control voltage changes from the previous value $V_{i-1}$ to a new value NA, where $V_i=V_{i-1}-k\cdot ERR$.

The timing of the components 8, 9, 10, 11, 12, 13, 14 and the application of the gain factors G1 and G2 are controlled by the control signal CTRL.

Any error in the signal path between the switch 2 (see FIG. 1) and the first differential amplifier 12 (see FIG. 3) will be compensated as described above with reference to FIG. 1.

Figure 4:
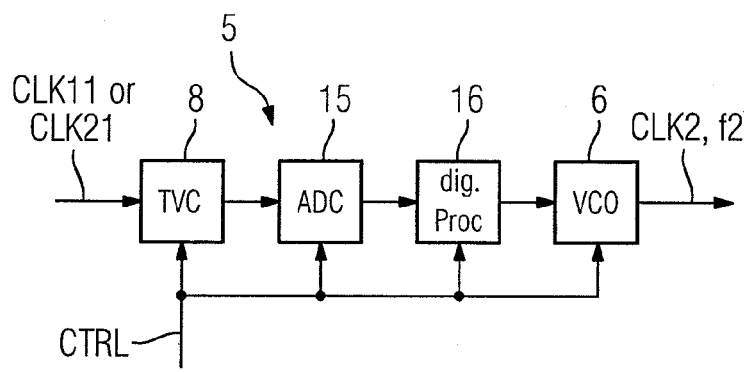
FIG. 4 is an alternative exemplary embodiment of a schematic block diagram of a phase/period comparator forming part of the clock generation system shown in FIG. 1.

FIG. 4 shows an alternative exemplary schematic block diagram of the above-described mixed analog and digital phase/period comparator 5, where the variable gain amplifier 9 and sample-and-hold circuits 10, 11 are replaced by an analog-to-digital converter 15 and where the differential amplifiers 12, 13 and sample-and-hold circuit 14 are replaced by a digital processor 16. In all other respects, the phase/period comparator 5 works in a manner as described above.

Figure 5:
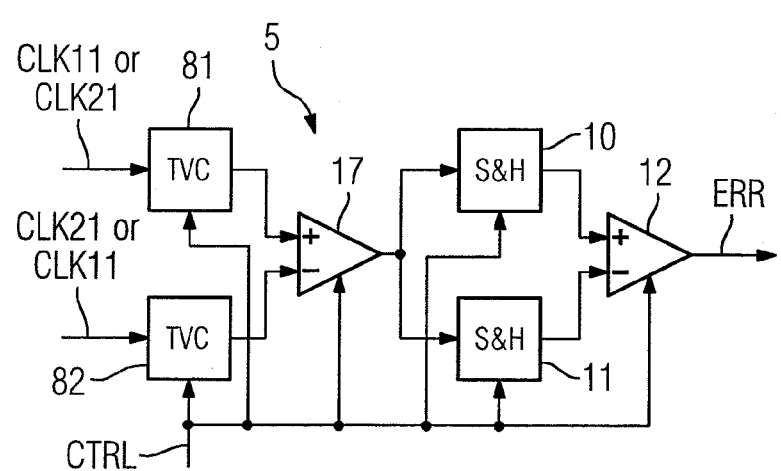
FIG. 5 is an exemplary embodiment of a phase/period comparator forming part of the alternative exemplary clock generation system shown in FIG. 2.

FIG. 5 shows an exemplary schematic block diagram of a mixed analog and digital circuit of the phase/period comparator 5 of the clock generation system shown in FIG. 2. Here, the phase/period comparator 5 comprises a first time-to-voltage converter 81 connected to the output of the first frequency divider 41 (see FIG. 2) and a second time-to-voltage converter 82 connected to the output of the second frequency divider 42. The time-to-voltage converters 81 and 82 are connected to a differential amplifier 17 that has the variable gain functionality corresponding to that of the variable gain amplifier 9 of FIG. 3. The control voltage for the voltage controlled oscillator is adjusted the same way as described above for the phase/frequency comparator in FIG. 3.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A clock generation system for generating a first clock signal at a first clock frequency and a second clock signal at a second clock frequency with a predetermined ratio to said first clock frequency, the system comprising:
 a clock signal generator providing the first clock signal;
 a frequency divider device having at least one frequency divider for dividing the first clock frequency by a first integer to produce a first auxiliary signal and for dividing the second clock signal by a second integer to produce a second auxiliary signal;
 a phase/period comparator configured to generate an error signal by comparing the first and second auxiliary signals;
 a voltage-controlled oscillator controlled in dependence on said error signal to generate said second clock signal;
 a switch configured to alternately switch each of the first and second clock signals to a single frequency divider or to alternately switch one of the first and second clock signals to one of two frequency dividers and simultaneously switch another one of the first and second clock signals to the other one of the two frequency dividers; and
 a controller configured to control the at least one frequency divider to perform a division with the first integer when the first clock signal is provided and to perform the division with the second integer when the second clock signal is provided;
 wherein the phase/period comparator is configured to generate the error signal from the comparison of the first and second auxiliary signals obtained from two consecutive positions of the switch.

2. The clock generation system of claim 1, wherein the phase/period comparator is configured to generate the error signal by individually weighting and comparing cycle durations or phasing of the first and second auxiliary signals.

3. The clock generation system of claim 2, wherein the phase/period comparator comprises at least one time-to-voltage converter alternately receiving the first or second auxiliary signals and a voltage comparator for comparing the voltages generated by the at least one time-to-voltage converter from the first and second auxiliary signals.

* * * * *